United States Patent [19]

Madni et al.

[11] Patent Number: 4,649,553
[45] Date of Patent: Mar. 10, 1987

[54] MICROWAVE DIGITAL PHASE-SHIFTER APPARATUS AND METHOD FOR CONSTRUCTION

[76] Inventors: Asad M. Madni, 3582 Greenfield Ave., Los Angeles, Calif. 90034; Lawrence Wan, 17819 Joshua Cir., Fountain Valley, Calif. 92708

[21] Appl. No.: 717,132

[22] Filed: Mar. 26, 1985

[51] Int. Cl.[4] .......................................... H03K 5/159
[52] U.S. Cl. .................................... 377/43; 328/155; 328/55
[58] Field of Search .................. 377/43, 107, 110, 76, 377/2; 328/55, 155; 307/606

[56] References Cited

U.S. PATENT DOCUMENTS

| 2,910,586 | 10/1959 | Kohler | 328/155 |
|---|---|---|---|
| 2,961,535 | 11/1960 | Lanning | 328/55 |
| 3,502,976 | 3/1970 | Chamberlin, Jr. et al. | 328/155 |
| 3,636,477 | 1/1972 | Selz | 328/55 |
| 3,699,584 | 10/1972 | Hrivnak et al. | 328/155 |
| 3,742,360 | 6/1973 | Ragsdale | 328/155 |
| 4,014,238 | 3/1977 | Southard | 377/114 |
| 4,101,821 | 7/1978 | Kirby | 328/55 |
| 4,443,765 | 4/1984 | Findeisen et al. | 328/55 |

*Primary Examiner*—John S. Heyman
*Assistant Examiner*—Karl Ohralik
*Attorney, Agent, or Firm*—Flehr, Hohbach, Test, Albritton and Herbert

[57] ABSTRACT

An electronic phase shifter utilizes a serrodynable digital phase shifter which is driven by the output of a multi-bit counter. The counter in turn has its clock input driven by a pulse train which produces the desired frequency translation for noise and deception jamming. Alternatively, the counter has jam inputs for electronic antenna steering and electronic phase shift applications. In order to compensate for step phase error which causes undesirable spurious sidebands, the cells of the phase shifter are pretested for individual phase errors and an interface memory is provided which by use of a corrected counter code minimizes the errors.

9 Claims, 7 Drawing Figures

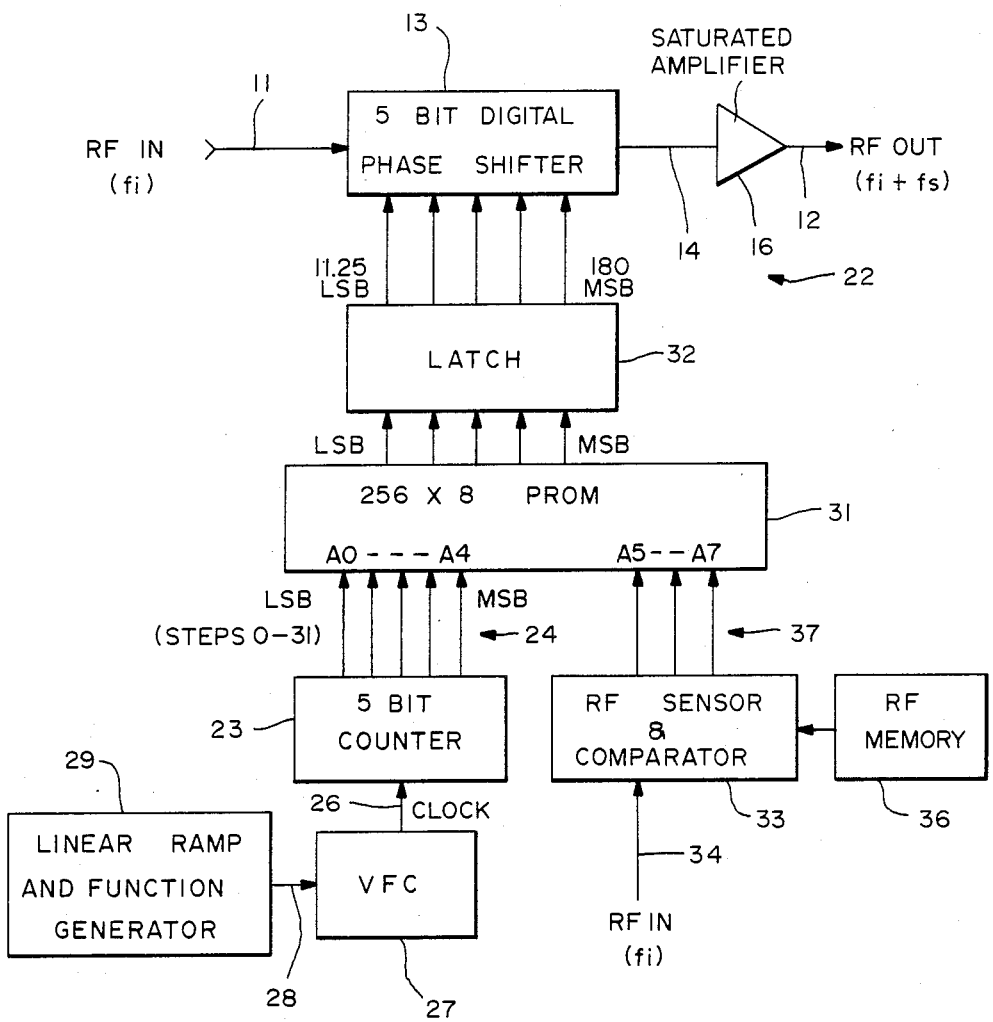
FIG.—1

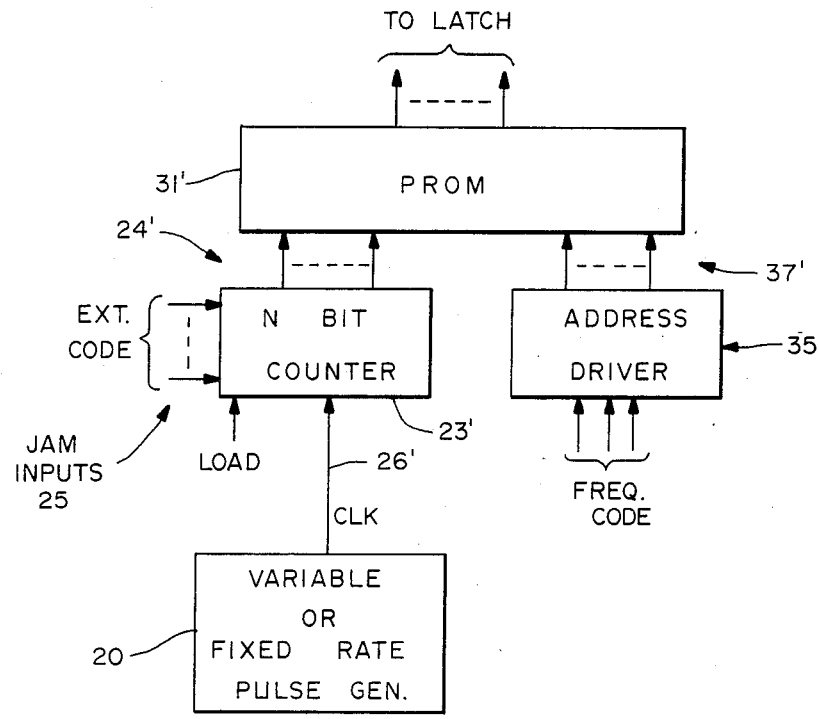
FIG.—IA
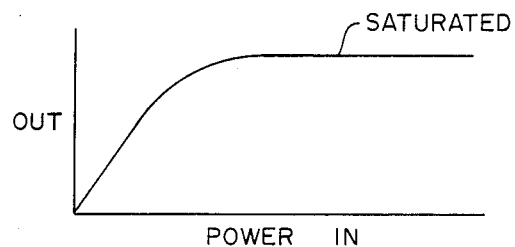
FIG.—IB
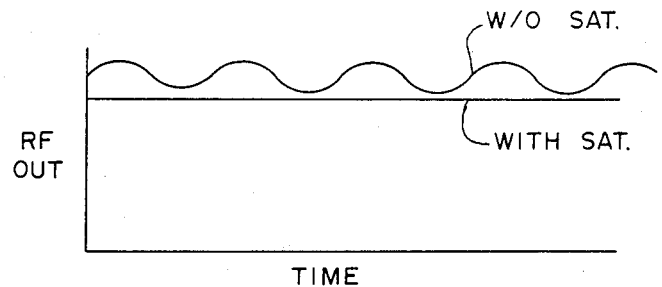
FIG.—IC

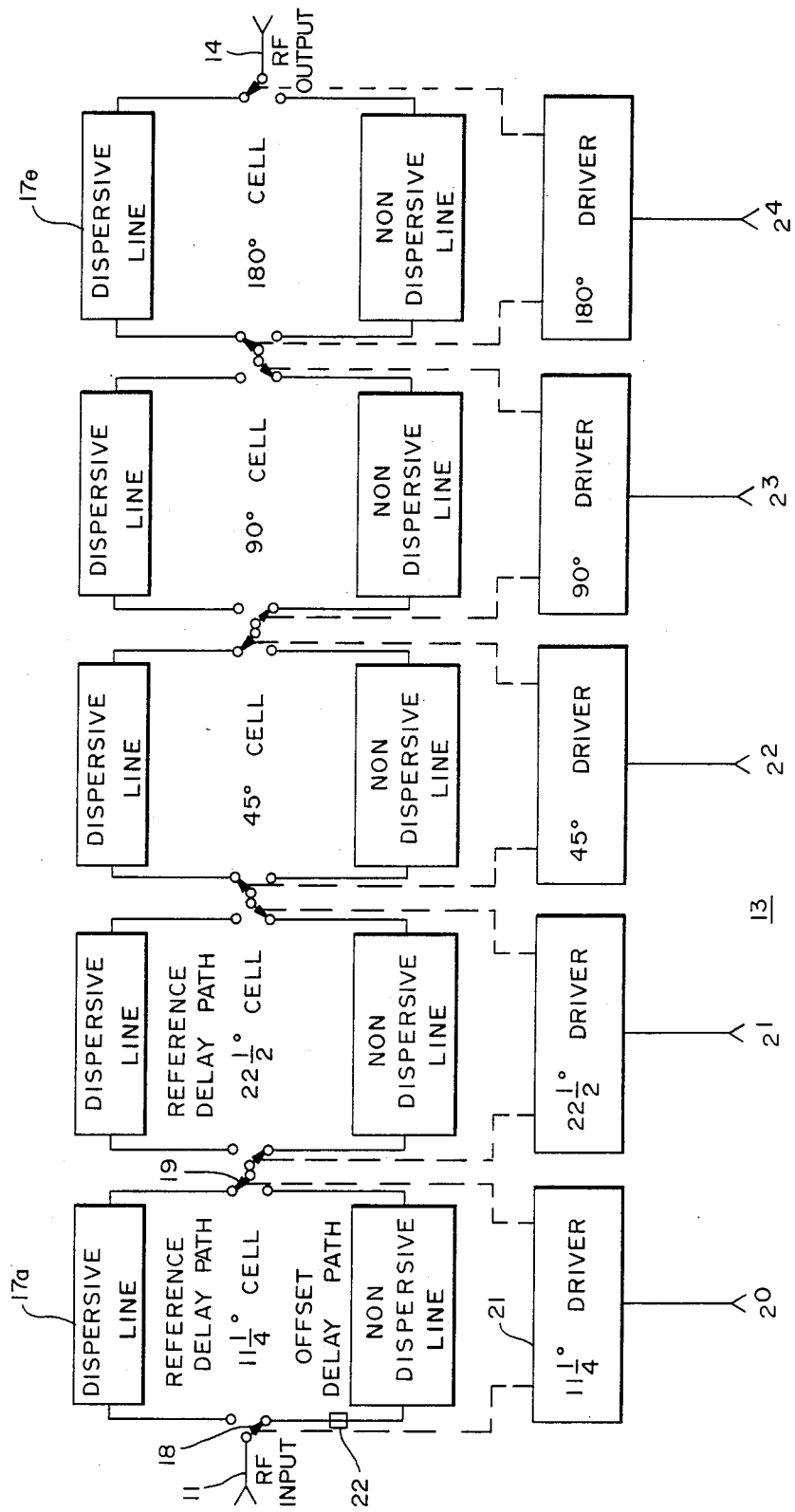
FIG.—2

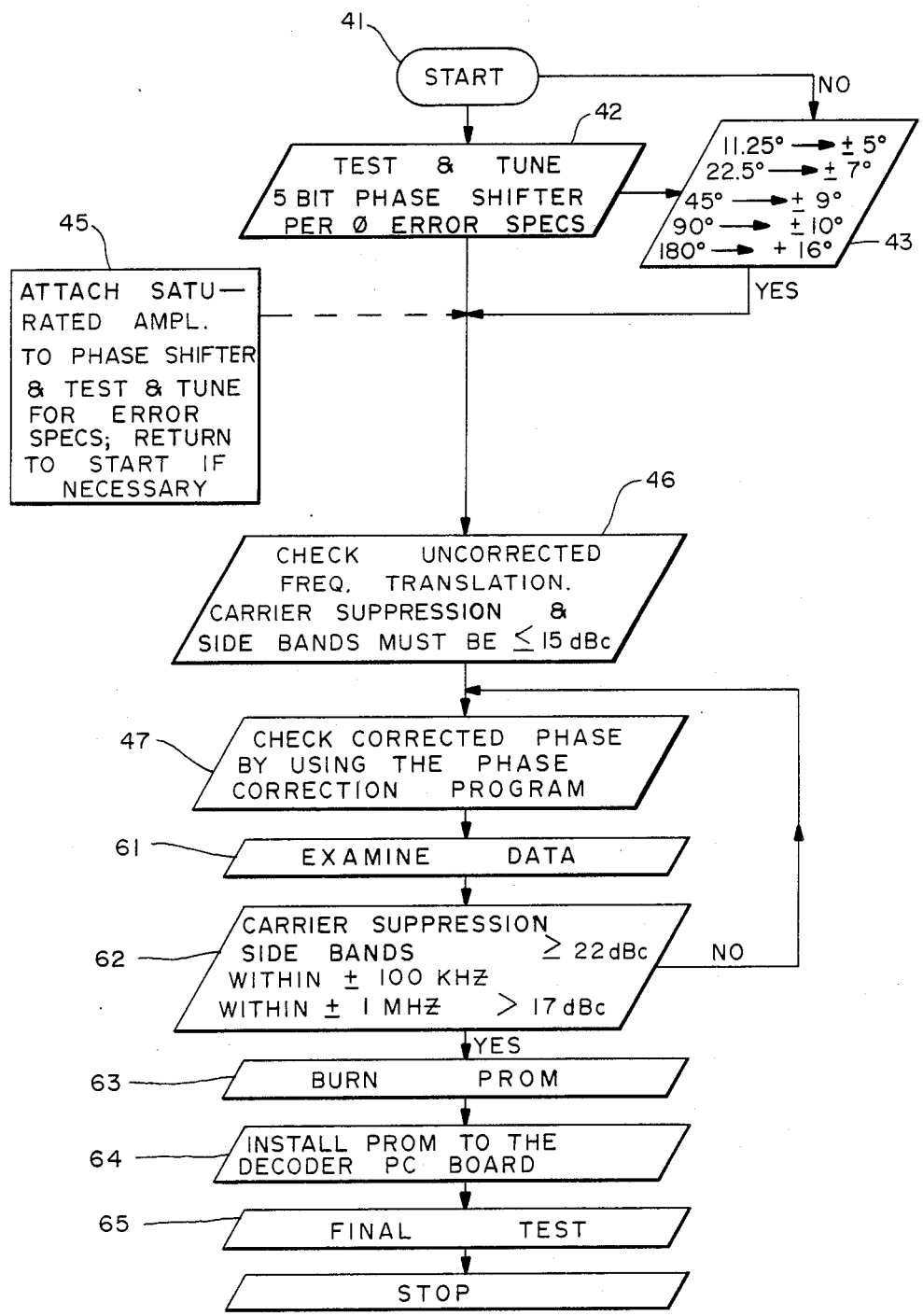
FIG.—3

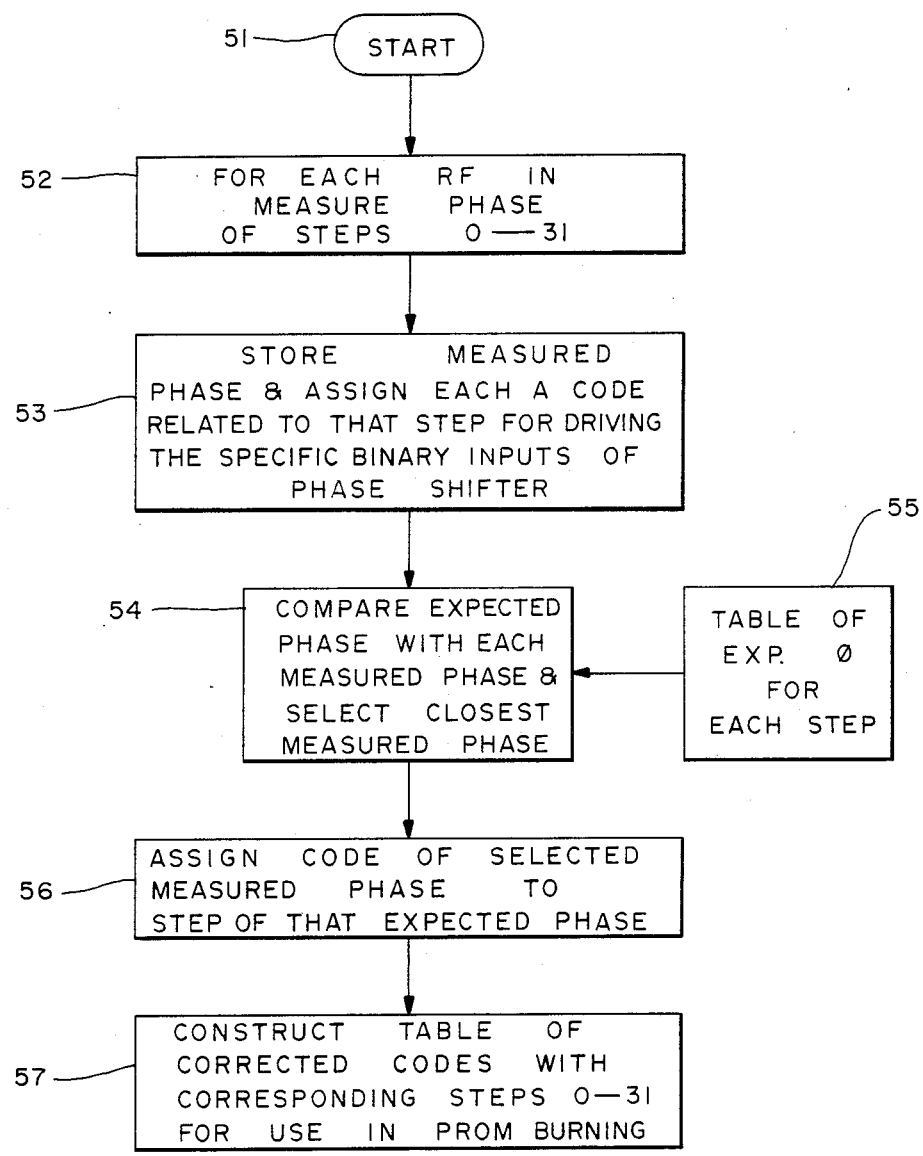
FIG.—4

TABLE 1A

BINARY CODE VS. PHASE SHIFT

| BINARY CODE | CELLS | | | | | PHASE SHIFT |
|---|---|---|---|---|---|---|
| MSB  LSB | $11\frac{1}{4}°$ | $22\frac{1}{2}°$ | 45° | 90° | 180° | |
| 00000 | | | | | | 0 |
| 00001 | X | | | | | 11.25 |
| 00010 | | X | | | | 22.5 |
| 00011 | X | X | | | | 33.75 |
| 00100 | | | X | | | 45.00 |
| 00101 | X | | X | | | 56.25 |
| 00110 | | X | X | | | 67.5 |
| 00111 | X | X | X | | | 78.75 |
| 01000 | | | | X | | 90.00 |
| 01001 | X | | | X | | 101.25 |
| 01010 | | X | | X | | 112.5 |
| 01011 | X | X | | X | | 123.75 |
| 01100 | | | X | X | | 135.00 |
| 01101 | X | | X | X | | 146.25 |
| 01110 | | X | X | X | | 157.50 |

TABLE 1B

| BINARY CODE | CELLS | | | | | PHASE SHIFT |
|---|---|---|---|---|---|---|
| | $11\frac{1}{4}°$ | $22\frac{1}{2}°$ | 45° | 90° | 180° | |
| 01111 | X | X | X | X |   | 168.75 |
| 10000 |   |   |   |   | X | 180.00 |
| 10001 | X |   |   |   | X | 191.25 |
| 10010 |   | X |   |   | X | 202.50 |
| 10011 | X | X |   |   | X | 213.75 |
| 10100 |   |   | X |   | X | 225.00 |
| 10101 | X |   | X |   | X | 236.75 |
| 10110 |   | X | X |   | X | 247.50 |
| 10111 | X | X | X |   | X | 258.75 |
| 11000 |   |   |   | X | X | 270.00 |
| 11001 | X |   |   | X | X | 281.25 |
| 11010 |   | X |   | X | X | 292.50 |
| 11011 | X | X |   | X | X | 303.75 |
| 11100 |   |   | X | X | X | 315.00 |
| 11101 | X |   | X | X | X | 326.25 |
| 11110 |   | X | X | X | X | 337.50 |
| 11111 | X | X | X | X | X | 348.75 |

TABLE II

| STEP | CODE | EXPECTED PHASE | MEASURED PHASE | PHASE ERR BEF. COR. | CORRECTED CODE | PHASE AFTER CORRECTION | PHASE ERR AFT. COR. |
|---|---|---|---|---|---|---|---|
| 00 | 0000 | 0.00 | 0.00 | 0.00 | 0000 | 0.00 | 0.00 |
| 01 | 0001 | 11.25 | 7.78 | -3.47 | 0001 | 7.78 | -3.47 |
| 02 | 0002 | 22.50 | 17.16 | -5.34 | 0003 | 23.53 | 1.03 |
| 03 | 0003 | 33.75 | 23.53 | -10.22 | 0003 | 23.53 | -10.22 |
| 04 | 0004 | 45.00 | 47.57 | 2.57 | 0004 | 47.57 | 2.57 |
| 05 | 0005 | 56.25 | 56.61 | .36 | 0005 | 56.61 | .36 |
| 06 | 0006 | 67.50 | 67.28 | -.22 | 0006 | 67.28 | -.22 |
| 07 | 0007 | 78.75 | 75.46 | -3.29 | 0007 | 75.46 | -3.29 |
| 08 | 0008 | 90.00 | 89.83 | -.17 | 0008 | 89.83 | -.17 |
| 09 | 0009 | 101.25 | 98.65 | -2.60 | 0009 | 98.65 | -2.60 |
| 10 | 000A | 112.50 | 112.33 | -.17 | 000A | 112.33 | -.17 |
| 11 | 000B | 123.75 | 120.80 | -2.95 | 000B | 120.80 | -2.95 |
| 12 | 000C | 135.00 | 138.12 | 3.12 | 000C | 138.12 | 3.12 |
| 13 | 000D | 146.25 | 146.25 | 0.00 | 000D | 146.25 | 0.00 |
| 14 | 000E | 157.50 | 160.01 | 2.51 | 0010 | 159.53 | 2.03 |
| 15 | 000F | 168.75 | 166.07 | -2.68 | 0011 | 167.77 | -.98 |
| 16 | 0010 | 180.00 | 159.53 | -20.47 | 0012 | 180.23 | .23 |
| 17 | 0011 | 191.25 | 167.77 | -23.48 | 0013 | 187.44 | -3.81 |
| 18 | 0012 | 202.50 | 180.23 | -22.27 | 0014 | 210.60 | 8.10 |
| 19 | 0013 | 213.75 | 187.44 | -26.31 | 0014 | 210.60 | -3.15 |
| 20 | 0014 | 225.00 | 210.60 | -14.40 | 0016 | 230.27 | 5.27 |
| 21 | 0015 | 236.25 | 218.60 | -17.65 | 0017 | 237.19 | .94 |
| 22 | 0016 | 247.50 | 230.27 | -17.23 | 0018 | 257.58 | 10.08 |
| 23 | 0017 | 258.75 | 237.19 | -21.56 | 0018 | 257.58 | -1.17 |
| 24 | 0018 | 270.00 | 257.58 | -12.42 | 0019 | 266.00 | -4.00 |
| 25 | 0019 | 281.25 | 266.00 | -15.25 | 001A | 280.07 | -1.18 |
| 26 | 001A | 292.50 | 280.07 | -12.43 | 001B | 286.92 | -5.58 |
| 27 | 001B | 303.75 | 286.92 | -16.83 | 001C | 303.61 | -.14 |
| 28 | 001C | 315.00 | 303.61 | -11.39 | 001D | 311.26 | -3.74 |
| 29 | 001D | 326.25 | 311.26 | -14.99 | 001E | 325.80 | -.45 |
| 30 | 001E | 337.50 | 325.80 | -11.70 | 001F | 332.64 | -4.86 |
| 31 | 001F | 348.75 | 332.64 | -16.11 | 001F | 332.64 | -16.11 |

MICROWAVE DIGITAL PHASE-SHIFTER APPARATUS AND METHOD FOR CONSTRUCTION

BACKGROUND OF THE INVENTION

The present invention is directed to a phase-shifter apparatus and method for construction and more specifically to a solid-state microwave digital diode phase shifter for noise and deception jamming and frequency translation (utilizing the serrodyne principle), for electronic antenna steering and electronic phaseshift applications.

One of the applications of the present invention is related to co-pending patent application Ser. No. 534,566, filed Sept. 22, 1983, the names of Asad M. Madni and Joseph Fala (Asad M. Madni is one of the co-inventors of the present application), entitled VELOCITY DECEPTION APPARATUS. The disclosure of the Madni/Fala application is hereby incorporated by reference.

That application discloses an electronic countermeasures (ECM) technique which produces slowly changing false doppler frequencies by a so-called velocity gate stealer (VGS). Such apparatus is mounted in an aircraft and when it receives a doppler pulse from ground which is operating on the doppler system it pulls the velocity tracker of the ground radar off the target to drop it. The ground radar may then lock on the clutter or be forced into a reacquisition sequence. The above application as its phase shift apparatus uses a serrodynable digital phase shifter of the Schiffman type where each cell of the phase shifter is driven by an output of a multi-bit counter whose clock input in turn is driven by a voltage-to-frequency converter which has a pulse train output which responds substantially instantaneously to the analog value of a linear or second order function which produces the desired frequency translation. Thus, this performs as a velocity gate stealer which produces slowly changing false doppler frequencies.

As discussed in the above co-pending application, since the frequency change must occur in discrete steps, spurious frequencies are inherently generated. If these are minimized at several decibels below the main output frequencies, the spurious sideband signals are not deleterious to the overall system operation.

Additionally, there are several other applications of the present invention, such as: one of the several electronic steering elements for electronically steered antennas, frequency translation and electronic phase shift. The use of digital phase shifters for electronically steered radar is generally discussed in the February 1985 of Scientific American.

OBJECT OF THE PRESENT INVENTION

It is an object of the present invention to provide a microwave digital diode phase shifter which has an improved phase error and an improved carrier and spurious sideband suppression (in the serrodyne mode) utilizing a digital correction scheme and also reduced amplitude modulation error.

In accordance with the above object, there is provided a phase-shifter apparatus for receiving microwave signals and phase shifting or frequency translating them comprising a solid-state variable phase shifter including a plurality of series coupled cells for inserting various and different phase shifts into the received microwave signals by binary inputs to selected cells, wherein each of the cells provide a nominal or expected phase shift so that driving the binary inputs with an incrementally increasing or decreasing binary number will cause step increases or decreases in the expected phase shift of the series combinations of the cells. This includes a multi-bit counter having a number of binary outputs corresponding to the binary inputs of the plurality of cells for providing the binary number. Memory means connect the multi-bit counter to the phase shifter. The memory means which have stored therein a corrected combination of the cells to provide a minimal phase error compared to the phase error produced by the binary incremental combinations of the cells. Finally, a means is provided for digitally driving the counter.

In addition, a method of construction of the phase shifter of the above type is provided which includes the following steps: There is determined for each of the steps of the incrementally increasing or decreasing binary number which drives the digital phase shifter the actual phase shift for a microwave signal input of a predetermined frequency. The actual phase shifts are compared with the expected phase shifts for each step. A pairing occurs with an actual phase shift which has a minimum phase error with respect to the expected phase shift, with the particular step of the expected phase shift. This is accomplished by storing in a permanent memory the step associated with the actual phase shift with the step of the expected phase shift.

BRIEF DESCRIPTION OF THE DRAWINGS

FIG. 1 is a block diagram of apparatus incorporating the present invention.

FIG. 1A is a block diagram illustrating an alternative embodiment.

FIGS. 1B and 1C are curves illustrating the operation of FIG. 1 in one mode.

FIG. 2 is a block diagram of a solid-state phase shifter used in the present invention.

FIG. 3 is a flow chart illustrating the method of the present invention.

FIG. 4 is a subroutine flow chart corresponding to a portion of the flow chart of FIG. 3.

Tables 1A and 1B illustrate the operation of the phase shifter.

Table 2 illustrates the operation of the phase shifter in practical operation and also its method of construction.

DESCRIPTION OF PREFERRED EMBODIMENT

The circuit of FIG. 1 would normally be inserted in a pod, for example, of an aerial target such as an airplane. As such, it receives a radio frequency input (RF IN) $f_i$ on a receiver/antenna 11 and produces on its output 12 a radio frequency output, that is, $f_i+f_s$, which has been frequency translated. This frequency translation is accomplished in block 13 designated 5 bit digital phase shifter. Its output on line 14 is amplified by amplifier 16 which has as its output the final RF OUT on line 12. Amplifier 16, which can be of the Gallium Arsenide field effect transistor (GAsFET) type, is normally operated in its saturated region as shown in FIG. 1B. This has the beneficial effect of removing any amplitude modulation (AM) in RF OUT. Such error will be discussed in detail below. Of course, for some uses an amplifier may not be necessary.

Phase shifter 13 is a solid-state digital phase shifter which consists of five sections or cells which can be switched in and out of a series path to insert various and different phase shifts into the RF circuit.

FIG. 2 illustrates this phase shifter 13 in greater detail. It consists of five cells 17a through 17e. Each is of the Schiffman type having the respective time delays indicated; viz 11¼, 22½, 45, 90 and 180°. Each cell contains two single pole double throw diode switches indicated schematically. For example, in the first cell 17a, these are indicated as switches 18 and 19 which switch the RF input signal between a reference delay path designated DISPERSIVE and an offset delay path designated NON-DISPERSIVE. In accordance with Schiffman cell technology, the radio frequency phase length of the NON-DISPERSIVE delay path is always greater in insertion delay than the reference delay path by a fixed differential frequency phase shift; in the case of cell 17a, this difference is 11¼° which is the weighted phase shift of that particular cell. Each cell includes an individual driver shown in cell 17a as driver 21 for driving the solid-state switches 18 and 19 which will alternately connect either the DISPERSIVE or NON-DISPERSIVE paths of the cell in response to the TTL inputs indicated at 22. These are designated $2^0$ to $2^4$. These inputs are, of course, also illustrated in FIG. 1.

Phase shifters other than the Schiffman type may be used such as line coupler, branch line, switched line, etc.

Tables 1A and 1B illustrate the operation of phase shifter 13. Since there are five binary inputs 22, there are 32 possible series combinations of the phase shifting cells. Both Tables 1A and 1B illustrate how a stepwise phase shift is accomplished from 0° to 360° in increments of 11¼° by applying to the binary inputs 22 a binary code which is in essence contains the binary equivalents of the decimal numbers 0 through 32.

By incrementally increasing the binary number, this will cause step increases of theoretically equal phase shifts as indicated by Tables 1A and 1B. And this is accomplished by connecting various series combinations of the cells. However, the phase shift indicated in the right-hand column of the tables is an expected phase shift which only applies if the nominal or expected phase shift of each of the individual five cells 17a through 17e are accurate. In practice, even though the Schiffman cell has a relatively large frequency range of operation, for example, 12-16 GHz depending on the range of the RF input, the phase shifts will vary. In addition, the phase shift for an individual Schiffman cell even though operating within tolerances when it is used by itself, for example, the step (1) where only the 11¼° cell is used, may not operate in the same manner when it is combined with other cells due to impedance mismatches. All of the foregoing causes step phase error which directly affects the relative amplitude of spurious sidebands. As discussed in the above co-pending application, the 33rd and 65th sidebands on the positive side of the spectrum and the 31st and 63rd are most critical with a 32 step operation. This is for positive frequency translation to simulate a closing between target and ground. For negative translation (OPENING), the critical sidebands are the reverse of the above. The foregoing is accomplished by decreasing the count monotonically. In the velocity deception apparatus of this type, it is desired that these sidebands be suppressed as much as possible. If a different number of steps is used, then other sidebands will become critical.

Another parameter to be considered, is carrier suppression; that is, the suppression of the initial received RF frequency $f_i$. It is, of course, desirable that the translated carrier, RF OUT, has as high a magnitude as possible relative to the initial RF IN carrier. Carrier suppression relative to the translated carrier will improve with an increase in the number of steps. Thus, for an infinite number (analog) the suppressed carrier will disappear. Again, errors in phase steps, either individually or due to combinations, will affect this performance.

Referring now back to FIG. 1, a binary code having the 32 steps is produced in the following manner. A 5 bit counter 23 has binary outputs 24 corresponding to the binary inputs 22 of the phase shifter 13. The least significant (LSB) and most significant (MSB) bits are indicated. Counter 22 is driven at its clock input 26 by a voltage-to-frequency converter 27. Converter 27 provides at its output 26 a pulse train of binary pulses which varies with and is proportional to the instantaneous voltage magnitude of an analog input voltage on its input 28. This analog voltage is produced by the linear ramp and function generator circuits 29 which are shown in greater detail in the above co-pending application. However, very briefly this analog voltage may be either a ramp or a parabolic function. In addition, provision has been made, as is explained in the co-pending application, for dwell and walk times.

The output of the 5 bit counter 23 drives a permanent memory or PROM (programmable read only memory) circuit 31. This memory in essence connects the counter 23 to the inputs 22 of shifter 13 via a latch circuit 32 which provides for settling time. In summary, the PROM memory 31 provides a corrected series combination of the cells of phase shifter 13 to provide a minimal phase error. This is to be compared to the phase error which would be produced by the standard binary incremental combination of the cells as shown in Tables 1A and 1B.

In addition, PROM 31 contains additional inputs designated A5 through A7 which are driven by an RF sensor and comparator circuit 33. The object of this circuit is to allow a change in the correction combinations being made for each different RF input frequency $f_i$. Thus, the comparator compares the actual RF input frequency on line 34 with a choice, in this specific embodiment, of eight different frequencies which are stored in RF memory 36. In other words, the corrected combinations have previously been made in PROM 31 for eight different predetermined and preselected frequencies. The RF sensor and comparator 33 converts the RF input to a digital number which is compared to the digital number in RF memory 36 representing that particular frequency and then the appropriate binary inputs 37 are activated to enable the appropriate memory section of PROM 31.

While the embodiment of FIG. 1 is specifically directed to a velocity deception system, the broader aspects of the invention are illustrated in FIG. 1A. Here, the PROM 31' is shown in generalized form and it may have a multi-line input 24' (that is, less or greater than five) driven by an N bit counter 23'. In other words, a greater number of steps than 32 is possible. The clock input of the counter 23 is then driven by a variable or fixed rate pulse generator 20. Alternatively, where a fixed phase is desired or for use with a steered antenna, jam inputs 25 are provided which as shown are driven by an externally applied digital code and loaded into the counter by the load command. This enables the phase shifter to be set at any predetermined phase for use as, for example, a steered radar antenna.

Similarly in the case of the selection of the stored error corrections for a particular frequency, the inputs 37' may consist of as many lines as desired to provide a larger number of frequencies. The address driver 35 is responsive to an input freqency code which may be provided by an appropriate microprocessor or, alternatively, by a digital instantaneous frequency monitor (DIFM).

Thus, in summary, FIG. 1A illustrates more aptly the scope of the invention for electronic antenna steering and phase shift applications in general in addition to velocity deception.

FIG. 3 illustrates the process for correcting or at least minimizing step phase errors and creating the PROM unit 31. This PROM unit, of course, is dedicated and unique to a particular phase shifter circuit 13. The steps of FIG. 3 are accomplished by connecting at least a portion of the circuit of FIG. 1, which would include at least the phase shifter 13, to test instruments which might include an automatic network analyzer, for example, the Hewlett Packard Model 8408, a minicomputer controller such as the Hewlett Packard Model 85B and a PROM programmer which in essence burns in or stores information on PROM 31. The above set-up and interconnections are elementary and, thus, have not been separately shown.

Referring to FIG. 3, after the start step of 41, in step 42 the phase shifter 13 is tested to determine the phase error of each of its five cells 17a through 17e. In 43, the tested phase shift is compared with the indicated tolerances; for example, for cell 17a which has an expected or nominal shift of 11.25° the tolerance is plus or minus 5°. If the cell is not within the tolerance, start is returned to in step 41. Referring to FIG. 2, if a particular cell is out of tolerance, for example cell 17a, a tab of dielectric material 44 such as alumina is placed on one of the metal paths. Depending on whether the error is plus or minus, the tab 44 can be placed also on the reference delay path portion.

All of the foregoing is repeated where a saturated amplifier 16 (see FIG. 1) is utilized. This is indicated in step 45 which states:

"Attach saturated amplifier to phase shifter and test and tune for error specifications. Return to start if necessary."

The reason for this step with the saturated amplifier is that the amplifier will inevitably due to its operation in a saturated region produce a different phase shift. The effect of the saturated amplifier is to eliminate amplitude modulation errors. In general, these errors are due to impedance mismatches and insertion loss differences between the various cells. A variation in these transmission losses over the length of the path inevitably results in AM modulation. This is especially critical in a serrodyning mode where in effect a sawtooth cycle occurs during the 32 shift increments. Thus, with respect to a 5 bit phase shifter, the 11.25° cell has 32 increments, the 180° cell operates at one cycle per sawtooth, the 45° cell four cycles, the 22½° cell eight cycles, and the 11.25° cell sixteen cycles per sawtooth cycle. Thus, AM sidebands are produced which add vectorially to the FM sidebands produced by the serrodyne technique to produce asymmetry in the resultant spectrum. The main effect of AM modulation will be on carrier suppression due to the weighted effect of the 180° cell differential gain. The use of the saturated amplifier 16 minimizes this AM modulation error.

When all the individual cells are brought to within tolerance, in step 43 a return is made to the main routine and step 46. This is designated "CHECK UNCORRECTED FREQUENCY TRANSLATION". "Carrier suppression and sidebands must be greater than 15 db." Here in this step by use of the automatic network analyzer, the circuit is run through the 32 steps, as specifically shown in Tables 1A and 1B, and for each step the sideband suppression is checked. Assuming this is successful, in step 47 the corrected phase is checked by using the phase correction program.

The above 15 dB tolerance number is only a typical guideline and may change for different specifications and applications.

Such program is shown in FIG. 4. After the start step 51, in step 52 for each RF IN, that is, of a particular frequency, the phase is measured for steps 0 through 31. In other words, the binary code of Tables 1A and 1B is stepped through for the digital phase shifter 13 (FIG. 1). A chosen RF frequency, for example, 12 GHz might be used as provided by the associated automatic network analyzer. Table II illustrates the results where in the left column under STEP are the 32 steps and under the MEASURED PHASE column is the phase shift actually measured for each step.

Still referring to FIG. 4, in step 53 the measured phase is stored in an associate minicomputer used for the testing procedure (but not shown) and a code is assigned to each step. As illustrated in Table II, the code for convenience is a hexadecimal code which, however, has exact equivalence to the 5 bit binary code illustrated in Tables 1A and 1B. The relationship is indicated by the decimal step number in the left column of Table II.

As explained above, for each of the 32 steps there is an expected phase shift which is arrived at merely arithmetically as illustrated by Tables 1A and 1B.

Next, in step 54, the expected phase and measured phase are compared and the measured phase which has the closest magnitude to the expected phase is selected. Note that this is done with the aid of the table, step 55, which in essence is Table II.

Referring briefly to the contents of Table II in more detail, there is listed a "phase error before correction" column. This illustrates the difference between the actual and expected phase for each step if the phase shifter were to be operated in the normal manner where the binary code as illustrated in Tables 1A and 1B is utilized as a simple binary number to be numerically incremented to combine the cells to produce the expected phase. As is apparent, these errors in the fifth column are fairly significant and represent a step phase error which cause undesirable spurious sidebands of a greater magnitude than desired and also a carrier frequency of greater magnitude than desired.

Next, referring to FIG. 4 in step 56, the code of the selected measured phase which is closest to the expected phase for a particular step is assigned to that step of the expected phase. This is indicated by the "corrected code" column of Table II. Specifically, note that in the decimal step "02" whereas the initial code was "0002" it is now been corrected to "0003". This is because the measured phase in step 3 of 23.53° is the closest to the expected phase of step 2 of 22.50°. Note, that the phase error after correction, the last column of Table II, has been reduced to a positive 1.03° from a negative 5.34°. Simiarly by inspection, other corrected codes are apparent.

Thus, as indicated in step 57, a table of corrected codes corresponding to steps 0 through 31 is constructed identical to Table II for use in the burning in of PROM 31. Specifically, referring to FIG. 1, by the use of a PROM programmer, that is, the Hewlett-Packard 85B device, the inputs A0 through A4 are sequentially stepped from 0 to 32 and the corrected code inputs are sequentially entered. This would be done, of course, in a pure binary number form rather than the hexadecimal as illustrated. Thus, in summary, a pairing is accomplished in PROM 31 by storing in the permanent memory the step associated with the corrected code in conjunction with the decimal step 0 through 31 of the normal expected phase shift. This procedure is repeated for each desired RF input frequency. In a preferred embodiment, eight different frequencies are possible as discussed in conjunction with the inputs 37 of PROM 31.

Referring back again to FIG. 3, the process is completed as indicated in step 61 by examining the data which includes the final column of Table II which is "phase error after correction". If phase error is not sufficiently reduced, perhaps a cell might be retuned or the entire cell discarded. In addition, data can be examined by a network analyzer which will provide a graphical output showing sideband suppression, etc. This is done partially in step 62 where sidebands within + or −100 KHz must be reduced by 22 db and within + or −1 MHz reduced by 17 db and also carrier suppression must be similarly reduced. All of these tolerance numbers are typical only and may vary depending on specifications and applications. After these checks are made, the PROM memory is "burned in" in step 63. It is then installed in the remainder of the circuit as illustrated in FIG. 1 in step 64 and a final test step 65 is made to determine how it will work with the actual circuitry of the velocity deception apparatus.

Thus, the present invention provides an improved microwave digital phase shifter for use in velocity deception techniques, electronic phase shifter applications in general, and for use in steerable antennas. Improved sideband suppression and carrier suppression is provided by making a more accurate stepwise frequency progression. AM modulation error is reduced by use of a saturated amplifier.

What is claimed:

1. Phase-shifter apparatus for receiving radar or other microwave signals and phase shifting or frequency translating them comprising:
   a solid-state variable phase shifter including a plurality of series coupled cells for inserting various and different phase shifts into said received microwave signals by binary inputs to selected cells each of said cells providing a nominal or expected phase shift so that driving said binary inputs with an incrementally increasing or decreasing binary number will cause step increases or decreases in expected phase shift of the series combination of the cells;
   multi-bit counter means having a number of binary outputs corresponding to said binary inputs of said plurality of cells for providing said binary number, said counter also having activating inputs including at least one of the group consisting of a clock input and a jam input;
   memory means for connecting said multi-bit counter means to said phase shifter, said memory means having permanently stored therein a predetermined code corresponding to a corrected combination of selected cells to provide a minimal phase error compared to the phase error produced by the said binary incremental combinations of said cells; said predetermined combination being selectable by said counter means and
   means for digitally driving said counter.

2. Phase-shifter apparatus as in claim 1 where said digital driving means includes a said clock input for said counter and means for driving said clock input with a train of binary pulses.

3. Phase-shifter apparatus as in claim 1 where said digital driving means includes a said jam input to said counter for applying a fixed binary code to said counter to provide a fixed phase shift.

4. Phase-shifter apparatus as in claim 1 including an output amplifier series connected to said phase shifter said amplifier being operated in its saturated region.

5. Apparatus as in claim 1 where said microwave signals include a plurality of different frequencies and where separate corrections for each frequency of microwave signal are stored in said memory means.

6. A method of constructing a digital phase shifter having a plurality of series coupled cells for inserting a predetermined plurality of phase shifts of discrete steps into received microwave signals by binary inputs to selected cells, each of said cells having a nominal or expected phase shift so that driving said binary inputs with an incrementally increasing or decreasing binary number will cause step increases or decreases in phase shift, where phase errors in said cells will cause a step phase error comprising the following steps;
   determining for each of said steps the actual phase shift for a microwave signal input of a predetermined frequency;
   comparing said actual phase shifts with said expected phase shifts for each step and pairing for each step an actual phase shift, which has the minimum phase error with respect to said expected phase shift, with the particular said step of said expected phase shift,
   said pairing being accomplished by storing in a permanent memory said step associated with said actual phase shift with said step of said expected phase shift whereby said memory may be driven with said incrementally increasing or decreasing binary number to provide at its output a sequence of binary input numbers which cause said cells to provide phase shifts with minimum phase error.

7. A method as in claim 6 including the step of initially retuning individual cells to fall within predetermined tolerances.

8. A method as in claim 6 including the step of repeating all of said above steps for another and different said predetermined frequency.

9. A method as in claim 6 including the step of measuring said actual phase shifts while operating in the saturated range of an output amplifier.

* * * * *